United States Patent
Owens et al.

(10) Patent No.: US 9,000,771 B2
(45) Date of Patent: Apr. 7, 2015

(54) AUTOMOTIVE BATTERY CIRCUIT FAULT DETECTION

(75) Inventors: Richard Owens, Powell, OH (US); Makoto Murata, Shioyagun (JP); Tadashi Fujiwara, Dublin, OH (US)

(73) Assignee: Honda Motor Co., Ltd., Tokyo (JP)

( * ) Notice: Subject to any disclaimer, the term of this patent is extended or adjusted under 35 U.S.C. 154(b) by 1560 days.

(21) Appl. No.: 12/271,533

(22) Filed: Nov. 14, 2008

(65) Prior Publication Data
US 2010/0123465 A1    May 20, 2010

(51) Int. Cl.
G01R 31/00    (2006.01)
G01R 31/02    (2006.01)

(52) U.S. Cl.
CPC ............ *G01R 31/026* (2013.01); *G01R 31/006* (2013.01)

(58) Field of Classification Search
USPC ......................................................... 324/503
See application file for complete search history.

(56) References Cited

U.S. PATENT DOCUMENTS

| | | | |
|---|---|---|---|
| 3,601,655 A | | 8/1971 | Andersen |
| 3,889,248 A | * | 6/1975 | Ritter .................... 340/636.11 |
| 4,023,153 A | | 5/1977 | Adachi |
| 4,074,145 A | * | 2/1978 | Laffoon et al. ............. 307/10.1 |
| 4,153,923 A | | 5/1979 | Graf |
| 4,413,228 A | | 11/1983 | Turner, Jr. |
| 5,684,370 A | | 11/1997 | Watanabe |
| 5,754,114 A | | 5/1998 | Gnadt |
| 5,818,673 A | * | 10/1998 | Matsumaru et al. .......... 361/63 |
| 6,194,877 B1 | * | 2/2001 | Judge et al. ................ 322/28 |
| 7,005,995 B2 | | 2/2006 | Hornsby et al. |
| 2002/0113594 A1 | * | 8/2002 | Satake .................... 324/427 |
| 2003/0236599 A1 | | 12/2003 | Saito et al. |
| 2004/0051500 A1 | * | 3/2004 | Kuroda et al. ............. 320/104 |
| 2004/0145256 A1 | * | 7/2004 | Miekka et al. ............ 310/68 R |
| 2004/0189254 A1 | | 9/2004 | Kapsokavathis et al. |
| 2005/0285445 A1 | | 12/2005 | Wruck et al. |
| 2006/0273762 A1 | * | 12/2006 | Yamaji et al. ............. 320/132 |
| 2010/0026306 A1 | * | 2/2010 | Zhang et al. ............. 324/426 |

FOREIGN PATENT DOCUMENTS

| | | |
|---|---|---|
| JP | 11-334498 | 12/1999 |
| JP | 2000-179374 | 6/2000 |
| JP | 2007-274885 | 10/2007 |

OTHER PUBLICATIONS

PCT International Search Report, Mar. 13, 2009.
(Continued)

*Primary Examiner* — Benjamin M Baldridge
(74) *Attorney, Agent, or Firm* — Mark E. Duell; Rankin, Hill & Clark LLP

(57) ABSTRACT

A vehicle having an electrical system including an electric power generator arranged to selectively provide electric power to an electrical load of the vehicle and to selectively charge a battery of the vehicle. A fault detection system is provided for detecting an open circuit or high resistance fault in a ground circuit. The fault detection system includes a controller that controls a voltage output of the generator so as to either restrict or suspend charging or increase or start charging of the battery by the generator for a designated test period. A determining means determines a current discharge from or charging current into the battery during the test period, wherein if the determined current discharge or charging current is less than a given threshold, then an open circuit or high resistance fault is deemed to be detected in the ground circuit.

19 Claims, 3 Drawing Sheets

(56) References Cited

OTHER PUBLICATIONS

Patent Abstracts of Japan and Machine Translation of Japanese Publication No. 11-334498, published Dec. 7, 1999, 26 pages.

Patent Abstracts of Japan and Machine Translation of Japanese Publication No. 2007-274885, published Oct. 18, 2007, 22 pages.

Patent Abstracts of Japan and Machine Translation of Japanese Publication No. 2000-179374, published Jun. 27, 2000, 8 pages.

* cited by examiner

AUTOMOTIVE BATTERY CIRCUIT FAULT DETECTION

BACKGROUND

The present specification relates generally to the automotive arts. More specifically, the present specification relates to a method and/or system for detecting an open circuit and/or high resistance fault in the ground circuit of a vehicle's electrical system, e.g., a break or discontinuity in the ground wire from the vehicle's battery or otherwise. As can be appreciated, particular application is found in connection with an electrical system of a motor vehicle (e.g., an automobile or other vehicle driven by an internal combustion engine), and the specification makes particular reference thereto. However, it is to be appreciated that aspects of the present subject matter are also amenable to other like applications.

As is known in the art, many automotive vehicles generally include an internal combustion or other like engine that drives the vehicle. A modern vehicle is also typically provisioned with an electrical system including: (i) a battery which provides a source of electric power for starting the vehicle's engine; and, (ii) one or more electric circuits or loads (e.g., headlights, clocks, electrically powered adjustable components such as seats, mirrors or steering columns, interior cabin lights, electric heaters for seats, mirrors, windows or the like, radios and/or other entertainment systems, electronic memories for recording radio station presets and/or user preferred seat and/or mirror positions, electronic navigation systems, etc.) that may also be selectively powered by the vehicle's battery. Typically, the vehicle's electrical system also includes an electric generator or other like device that is driven by the engine to produce electric power when the engine is running. For example, such a device is an alternating current generator (ACG), also commonly referred to as an alternator. Generally, the generator or ACG is arranged to selectively provide electric power to the various electrical loads of the vehicle and/or to charge the battery.

A conventional generator or ACG of the type typically employed in an automotive vehicle is usually free to selectively operate in and/or cycle between one of two voltage output modes, e.g., depending on the operative state of the loads and/or demand for electric power from the generator or ACG. For example, in a first or HI output voltage mode, the output voltage of the generator or ACG is typically about 14.5 volts (V), and in a second or LO output voltage mode, the output voltage of the generator or ACG is typically about 12.5 V. Accordingly, when the electric power demand is relatively high or heavy, the generator or ACG normally operates in the HI output voltage mode, and when the electric power demand is relatively low or light, the generator or ACG normally operates in the LO output voltage mode. In customary automotive applications, the generator or ACG is generally free to selectively cycle between the two modes as the electric power demanded from the generator or ACG varies, e.g., due to changes in the operative states of the various loads.

Generally, the trend is to provide more electronic features and/or devices in a vehicle, which typically results in additional burden on the vehicle's battery and/or electrical system. Moreover, automobiles and/or other motor vehicles have been or are now being developed which additionally make use of the battery and/or electrical system to control, power and/or assist in the operation of features and/or systems which are increasingly important to the safe overall operation, driving and/or other like use of the vehicle (e.g., including electric brakes, electric steering, etc.). Accordingly, it becomes even more prudent to pay meaningful consideration to monitoring the battery and/or electrical system to be sure they are functioning properly.

Accordingly, a new and improved system and/or method is disclosed for detecting an open circuit fault in the ground circuit of a vehicle's electrical system.

SUMMARY

According to one aspect, in a vehicle having an electrical system including a ground circuit that provides an operative connection from the electrical system to an electrical ground and an electric power generator driven by an engine of the vehicle, the generator arranged to selectively provide electric power to an electrical load of the vehicle and to selectively charge a battery of the vehicle, a fault detection system is provided for detecting an open circuit or high resistance fault in the ground circuit. The fault detection system includes: a controller that controls a voltage output of the generator so as to at least one of restrict or suspend charging or increase or start charging of the battery by the generator for a designated test period; and, determining means for determining a current discharge from the battery or a charging current into the battery during the test period, wherein if the determined current discharge or charging current is less than a given threshold, then an open circuit or high resistance fault is deemed to be detected in the ground circuit.

According to another aspect, in a vehicle having an electrical system including a ground circuit that provides an operative connection from the electrical system to an electrical ground and an electric power generator driven by an engine of the vehicle, the generator arranged to selectively provide electric power to an electrical load of the vehicle and to selectively charge a battery of the vehicle, a method is provided for detecting an open circuit or high resistance fault in the ground circuit. The method includes: controlling a voltage output of the generator so as to at least one of restrict or suspend charging or increase or start charging of the battery by the generator for a designated test period; and, determining a current discharge from or charging current into the battery during the test period, wherein if the determined current discharge or charging current is less than a given threshold, then an open circuit fault is deemed to be detected in the ground circuit.

DETAILED DESCRIPTION

Figure 1:
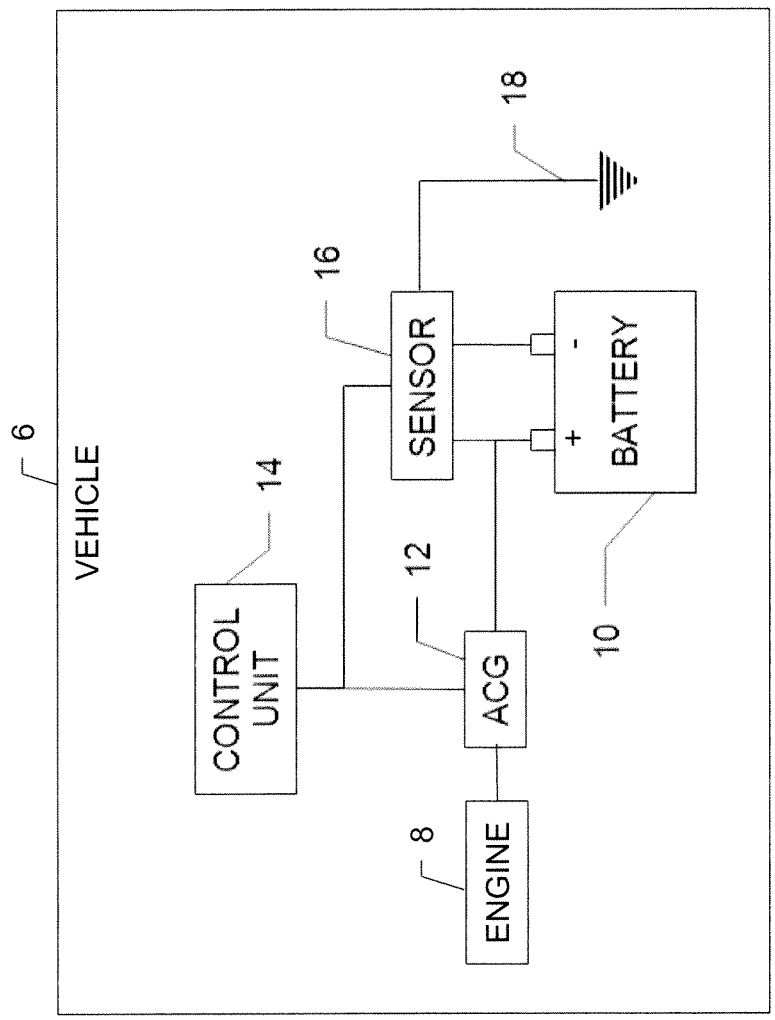
FIG. 1 is a schematic diagram showing an exemplary electrical system of a vehicle suitable for practicing aspects of the present disclosed subject matter.

Referring now to the drawings, wherein the showings are for purposes of illustrating one or more exemplary embodiments, FIG. 1 shows a schematic diagram of an electric system for a vehicle 6, e.g., such an automobile or other similar automotive vehicle. As shown, the vehicle 6 includes an engine 8 (e.g., an internal combustion engine or the like) that drives the vehicle 6. The vehicle 8 is also provisioned with an electrical system including: a battery 10 which suitably provides a source of electrical power for starting the engine 8 of the vehicle 6 (e.g., by selectively providing electric power to the vehicle's ignition system (not shown)); and, one or more electric circuits or loads (not shown) that may also be selectively powered by the vehicle's battery 10. For example, the loads may include: headlights; clocks; electrically powered adjustable components such as seats, mirrors or steering columns; interior cabin lights; electric heaters for seats, mirrors, windows or the like; radios and/or other entertainment systems; electronic memories for recording radio station presets and/or user preferred seat and/or mirror positions; electronic navigation systems; electrically controlled, powered and/or assisted brakes; electrically controlled, powered and/or assisted steering; etc. Suitably, the battery 10 is a nominal 12 volt (V) battery of the type commonly employed in automobiles or may be any other type of battery, e.g., typically used in automotive and/or motor vehicle applications.

The vehicle 6 also includes an electric generator 12 (e.g., an ACG or alternator or other like device commonly known and/or employed in the automotive or motor vehicle arts) that is driven by the engine 8 to produce electric power when the engine 8 is running. In the illustrated embodiment, the ACG 12 is also operatively connected to the battery 10 and/or the aforementioned electrical loads or otherwise arranged to selectively provide electric power to the aforementioned loads and/or to charge the battery 10. That is to say, when the engine 8 of the vehicle 6 is running, the engine 8 drives the ACG 12 which in turn normally provides electric current to charge the battery 10 and/or power the various electrical loads.

Suitably, the ACG 12 is a dual output mode ACG, capable of outputting or generating electrical power at one of two selected voltages, namely, a HI voltage output (e.g., approximately 14.5 V) and a LO voltage output (e.g., approximately 12.5 V). Customarily, the operation of the ACG 12 cycles between the HI and LO voltage output modes in response to various operating conditions. More specifically, the generator 12 is the type typically employed in an automotive vehicle and under normal operating conditions the generator 12 is free to selectively operate in and/or cycle between one of the two voltage output modes, e.g., depending on the operative state of the loads and/or demand for electric power from the generator 12. For example, in a first or HI output voltage mode, the output voltage of the generator 12 is typically about 14.5 V, and in a second or LO output voltage mode, the output voltage of the generator 12 is typically about 12.5 V. Optionally, these voltage values may vary, e.g., depending on the internal or other temperature of the generator 12. In a suitable embodiment, under normal operating conditions, when the demand for electric power is relatively high or heavy or when the battery 10 is to be charged, the generator 12 generally operates in the HI output voltage mode, and when the demand for electric power is relatively low or light or when the battery is allowed or desired to discharge, the generator 12 generally operates in the LO output voltage mode. That is to say, under normal operating conditions, the generator 12 is generally free to selectively cycle between the two modes as the electric power demanded from the generator 12 varies, e.g., due to changes in the operative states of the loads. Alternately, the ACG 12 is optionally a linear ACG that outputs an arbitrary voltage, e.g., commanded by a control unit 14.

Also illustrated in FIG. 1, are the control unit 14, a sensor 16 (e.g., a current sensor or the like) and a ground circuit 18 (e.g., a ground wire or the like). Suitably, the sensor 16 is operatively connected to the battery 10 as shown and/or otherwise arranged under the control of the control unit 14 to selectively measure and/or otherwise obtain a value representative of the charge and/or discharge current of the battery 10. As shown, the control unit 14 is operatively connected to both the generator 12 and the sensor 16 to suitably control and/or regulate operation thereof and/or obtain readings of measurements and/or data therefrom. Suitably, as illustrated, the ground circuit 18 optionally comprises a ground wire or other conductor operatively connecting the negative terminal of the battery 10 through the sensor 16 to an electrical ground, e.g., such a frame, chassis and/or body of the vehicle 6.

Generally, the present inventive subject matter is directed to detecting an open circuit fault or high resistance fault in the ground circuit (e.g., the ground circuit 18) of a vehicle's electrical system (e.g., such as the vehicle 6). To achieve the aforementioned fault detection, the charge or discharge current from the battery 10 is directly measured, indirectly measured and/or estimated from other operating parameters of the vehicle 6. More specifically, in one suitable embodiment, just after the vehicle 6 has been started (and periodically or intermittently thereafter), the control unit 14 commands, regulates or otherwise controls the ACG 12 so as to force the ACG 12 to operate for a brief test period in the LO voltage output mode or at an arbitrarily lower voltage, or optionally, the control unit 14 turns the ACG output off altogether during the test period. In any case, at this point (i.e., during the test period), a battery discharge current larger than zero will generally be experienced or otherwise achieved. Accordingly, during the test period, the control unit 14 instructs and/or requests the battery sensor 16 to take a measurement and/or return a reading of the present battery current. The obtained battery current is then compared with an expected, estimated and/or typical value (i.e., a threshold value). If the obtained battery current value (e.g., from the sensor 16) does not meet or exceed the threshold value, then the ground circuit 18 is deemed to be compromised (i.e., in an open circuit or high resistance fault condition). Suitably, a warning or other appropriate indication of the detected fault condition may then be provided. Alternately, the ACG 12 can be commanded to operate at a higher voltage and the battery charging current can be observed to determine the respective fault condition, more specifically the difference between the previous or pre-test period battery current and the present battery current during the test period.

With regard to the embodiment shown in FIG. 1, suitably the sensor 16 directly measures the battery current. However, in other suitable embodiments, the battery current may be indirectly measured by sensing or detecting the ACG output current and vehicle's electrical load current, or alternately, the battery current may be estimated based upon ACG operating curves and knowledge of the operational status of the vehicle's electrical loads. In yet other suitable embodiment, aspects of any combination of the three techniques may be combined as appropriate.

Figure 2:
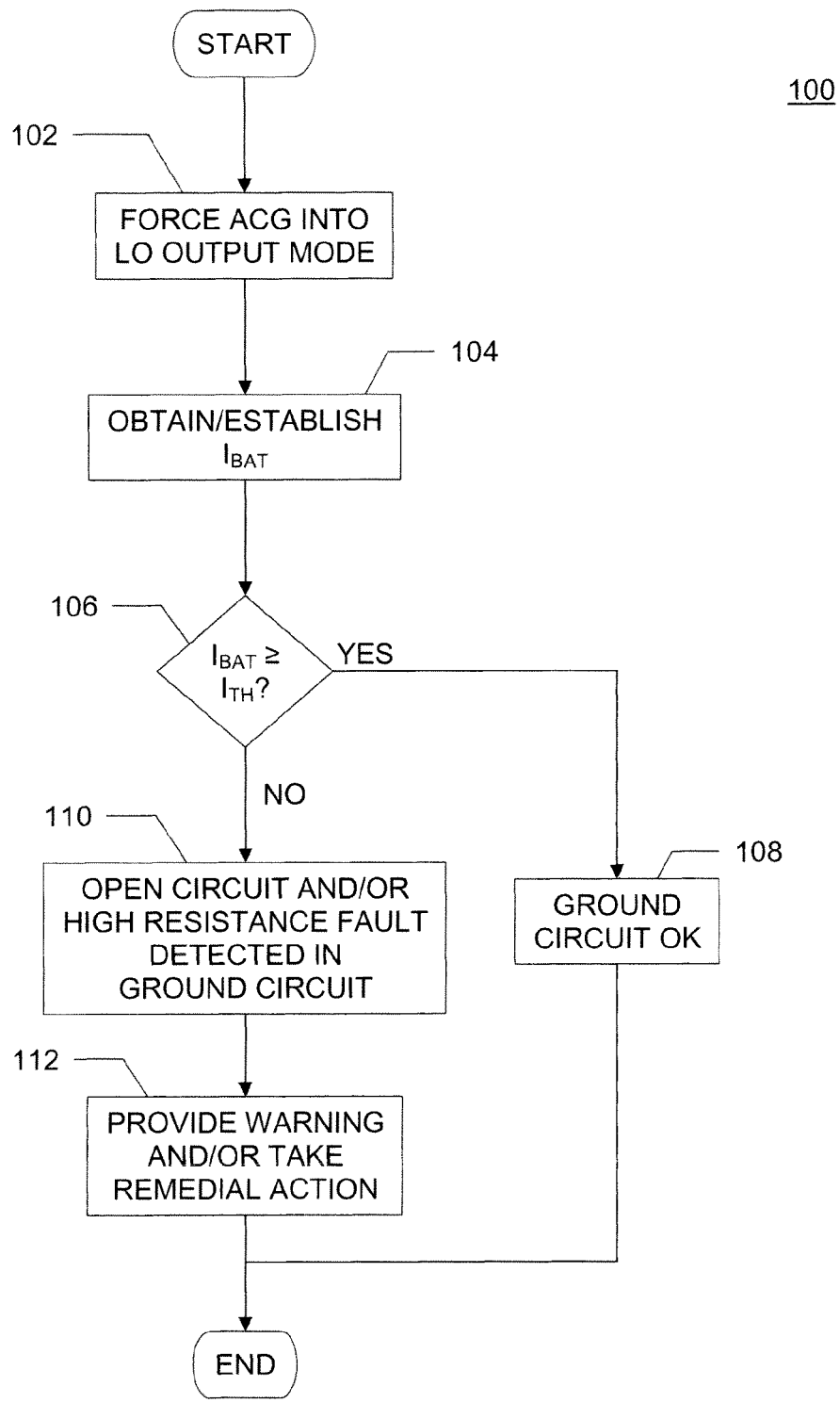
FIG. 2 is a flow chart showing an exemplary process for detecting an open circuit and/or high resistance fault in a vehicle's electrical system in accordance with aspects of the present disclosed subject matter.

With reference to FIG. 2, there is shown an exemplary process 100 for detecting an open circuit and/or high resistance fault condition in the ground circuit 18, e.g., a break or discontinuity in the ground wire or other like conductor. Suitably, the process is 100 is executed just after or nearly after the vehicle 6 is started (e.g. as detected by activation and/or operation of the vehicle's ignition system) and/or periodically or intermittently thereafter as desired to ensure that the ground circuit 18 is not compromised during otherwise normal operation of the vehicle 6.

Suitably, at a first step 102 in the process 100, the control unit 14 temporarily forces the ACG or generator 12 into the LO output voltage mode or optionally turns off, disables, discontinues or otherwise interrupts the output from the ACG 12 to the battery 10 altogether. For example, the control unit 14 optionally sends a suitable control or regulating signal to the ACG or generator 12 to achieve the foregoing result. In practice, this state is suitably maintained for a designated test period in which the battery discharge current is measured or otherwise obtained, e.g., at step 104. Once the test period is completed (i.e., once the battery discharge current has been established), then the control unit 14 suitably signals or otherwise permits the ACG or generator 12 to return to a normal operational state, i.e., freely switching or cycling between HI and LO output voltage modes as appropriate (e.g., depending on the demand from the electric loads being supplied electric power thereby).

As illustrated, at step 104, the control unit 14 reads a measurement or otherwise obtains a value for the battery discharge current. For example, the battery discharge current may be measured directly by the sensor 16 during the test period and supplied to the control unit 14 therefrom. Alternately, the battery discharge current may be indirectly measured by sensing or detecting the ACG output current and the vehicle's electrical load current, or alternately, the battery discharge current may be estimated based upon ACG operating curves and knowledge of the operational status of the vehicle's electrical loads, or some combination of the aforementioned direct measurement, indirect measurements and/or estimates may be made to obtain and/or establish a value for the battery discharge current during the test period. In any event, for notation purposes, this measured, obtained or otherwise established current for the battery 10 during the test period will be referred to as $I_{BAT}$ herein.

At decision step 106, the $I_{BAT}$ measured, obtained or otherwise established in step 104 is compared to a threshold value (for notation purposes referred to herein as $I_{TH}$), e.g., by the control unit 14. Suitably, $I_{TH}$ is selected, set and/or otherwise determined so as to represent a normal expected, estimated and/or typical value for $I_{BAT}$ under the test circumstances. As illustrated in the flow chart of FIG. 2, if $I_{BAT}$ meets or exceeds $I_{TH}$, then no open circuit or high resistance fault in the ground circuit 18 is deemed to have been detected, i.e., the ground circuit 18 is deemed "OK" or not compromised by an open circuit or high resistance fault as shown in box 108. Alternately, if $I_{BAT}$ is below or less than $I_{TH}$, then an open circuit or high resistance fault in the ground circuit 18 is deemed to have been detected, i.e., the ground circuit 18 is deemed to be compromised by an open circuit or high resistance fault as shown in box 110, e.g., there may be a discontinuity or break in the wire or conductor. Accordingly, at step 112, appropriate remedial action and/or a suitable warning is triggered, e.g., by the control unit 14. In one suitable embodiment, for example, a warning light, audible signal or other appropriate indictor perceivable by the vehicle operator (e.g., on the vehicle's dashboard, instrument panel or elsewhere within the vehicle cabin) is suitably activated or otherwise controlled to alert the vehicle operator of the detected fault condition in the ground circuit 18.

As can be appreciated from the foregoing description, FIG. 2 illustrates an exemplary process which is generally applicable when a dual output mode ACG 12 is being employed. In an alternate embodiment, e.g., when a linear ACG 12 is being employed, the exemplary process illustrated in FIG. 3 may optionally be employed.

Figure 3:
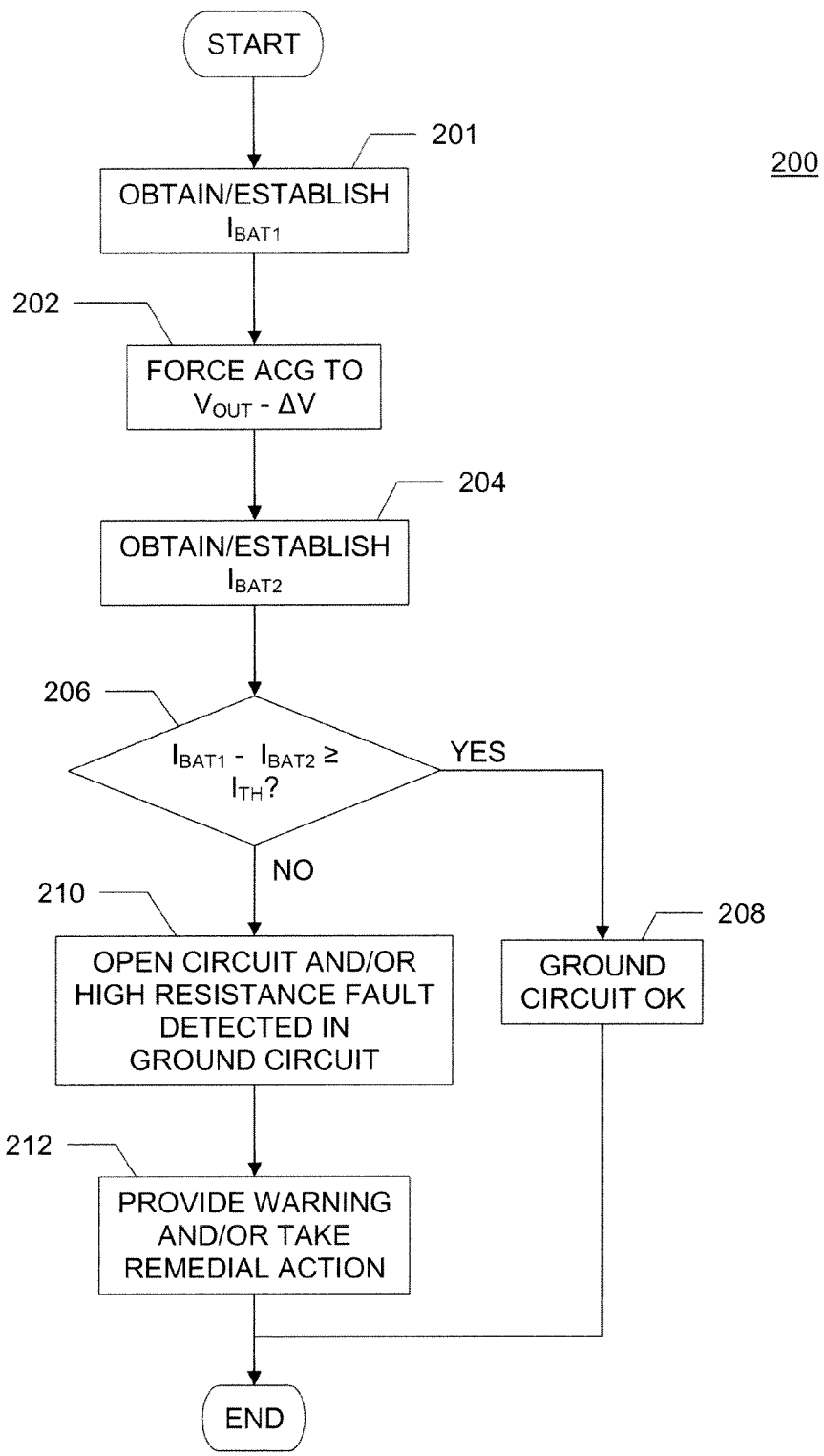
FIG. 3 is a flow chart showing another exemplary process for detecting an open circuit and/or high resistance fault in a vehicle's electrical system in accordance with aspects of the present disclosed subject matter.

With reference to FIG. 3, there is shown another exemplary process 200 for detecting an open circuit and/or high resistance fault condition in the ground circuit 18, e.g., a break or discontinuity in the ground wire or other like conductor. Suitably, the process is 200 is executed just after or nearly after the vehicle 6 is started (e.g. as detected by activation and/or operation of the vehicle's ignition system) and/or periodically or intermittently thereafter as desired to ensure that the ground circuit 18 is not compromised during otherwise normal operation of the vehicle 6.

As illustrated, at step 201, the control unit 14 reads a measurement or otherwise obtains a pre-test period value for the battery current. For example, the battery current may be measured directly by the sensor 16 and supplied to the control unit 14 therefrom. Alternately, the battery current may be indirectly measured by sensing or detecting the ACG output current and the vehicle's electrical load current, or alternately, the battery current may be estimated based upon ACG operating curves and knowledge of the operational status of the vehicle's electrical loads, or some combination of the aforementioned direct measurement, indirect measurements and/or estimates may be made to obtain and/or establish a value for the pre-test period battery current. In any event, for notation purposes, this measured, obtained or otherwise established current for the battery 10 will be referred to as $I_{BAT1}$ herein.

Suitably, at step 202 in the process 200, the control unit 14 temporarily forces the ACG or generator 12 to vary its output voltage by some selected, set or otherwise determined amount. That is to say, the ACG 12 is commanded by the control unit 14 so as to make the output voltage ($V_{OUT}$) of the ACG 12 change by a known amount ($\Delta V$). For example, the control unit 14 optionally sends a suitable control or regulating signal to the ACG or generator 12 to achieve the foregoing result. In practice, this state is suitably maintained for a designated test period in which the battery current is measured or otherwise obtained, e.g., at step 204. Once the test period is completed (i.e., once the test period battery current has been established), then the control unit 14 suitably signals or otherwise permits the ACG or generator 12 to return to a normal operational state.

As illustrated, at step 204, the control unit 14 reads a measurement or otherwise obtains a value for the battery current during the test period. For example, the battery current may be measured directly by the sensor 16 during the test period and supplied to the control unit 14 therefrom. Alternately, the battery current may be indirectly measured by sensing or detecting the ACG output current and the vehicle's electrical load current, or alternately, the battery current may be estimated based upon ACG operating curves and knowledge of the operational status of the vehicle's electrical loads, or some combination of the aforementioned direct measurement, indirect measurements and/or estimates may be made to obtain and/or establish a value for the battery current during the test period. In any event, for notation purposes, this measured, obtained or otherwise established current for the battery 10 during the test period will be referred to as $I_{BAT2}$ herein.

At decision step 206, the difference between $I_{BAT}$ and $I_{BAT2}$ measured, obtained or otherwise established in steps 201 and 204 is compared to a threshold value (for notation purposes referred to herein as $I_{TH}$), e.g., by the control unit 14. Suitably, $I_{TH}$ is selected, set and/or otherwise determined so as to represent a normal expected, estimated and/or typical difference under the test circumstances. As illustrated in the flow chart of FIG. 3, if the difference meets or exceeds $I_{TH}$, then no open circuit or high resistance fault in the ground circuit 18 is deemed to have been detected, i.e., the ground circuit 18 is deemed "OK" or not compromised by an open circuit or high resistance fault as shown in box 208. Alternately, if the difference is below or less than $I_{TH}$, then an open circuit or high resistance fault in the ground circuit 18 is deemed to have been detected, i.e., the ground circuit 18 is deemed to be compromised by an open circuit or high resistance fault as shown in box 210, e.g., there may be a discontinuity or break in the wire or conductor. Accordingly, at step 212, appropriate remedial action and/or a suitable warning is triggered, e.g., by the control unit 14. In one suitable embodiment, for example, a warning light, audible signal or other appropriate indictor perceivable by the vehicle operator (e.g., on the vehicle's dashboard, instrument panel or elsewhere within the vehicle cabin) is suitably activated or otherwise controlled to alert the vehicle operator of the detected fault condition in the ground circuit 18.

It is to be appreciated that in connection with the particular exemplary embodiments presented herein certain structural and/or function features are described as being incorporated in defined elements and/or components. However, it is contemplated that these features may, to the same or similar benefit, also likewise be incorporated in common elements and/or components where appropriate. For example, the sensor 16 and controller 14 may suitably be integrated together. It is also to be appreciated that different aspects of the exemplary embodiments may be selectively employed as appropriate to achieve other alternate embodiments suited for desired applications, the other alternate embodiments thereby realizing the respective advantages of the aspects incorporated therein.

It is also to be appreciated that particular elements or components described herein may have their functionality suitably implemented via hardware, software, firmware or a combination thereof. For example, the controller 14 and/or sensor 16 may be implemented as appropriate hardware circuits or alternately as microprocessors programmed to implement their respective functions. Additionally, it is to be appreciated that certain elements described herein as incorporated together may under suitable circumstances be stand-alone elements or otherwise divided. Similarly, a plurality of particular functions described as being carried out by one particular element may be carried out by a plurality of distinct elements acting independently to carry out individual functions, or certain individual functions may be split-up and carried out by a plurality of distinct elements acting in concert. Alternately, some elements or components otherwise described and/or shown herein as distinct from one another may be physically or functionally combined where appropriate.

In short, it will be appreciated that various of the above-disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be encompassed by the following claims.

The invention claimed is:

1. In a vehicle having an electrical system including a ground circuit that provides an operative connection from the electrical system to an electrical ground and an electric power generator driven by an engine of the vehicle, said generator arranged to selectively provide electric power to an electrical load of the vehicle and to selectively charge a battery of the vehicle, a fault detection system for detecting at least one of an open circuit or high resistance fault in the ground circuit, said fault detection system comprising:

a controller that controls a voltage output of the generator so as to at least one of restrict or suspend charging of the battery or increase or start charging of the battery by the generator for a designated test period; and a sensor for measuring at least one of a current discharge from the battery during the test period or a charging current into the battery during the test period;

wherein the controller is configured such that if the measured current discharge from the battery during the test period or the measured charging current into the battery during the test period is less than a given threshold, then the controller determines at least one of an open circuit or high resistance fault is deemed to be detected in the ground circuit.

2. The fault detection system of claim 1, wherein the generator is operable in one of two modes including a HI voltage output mode and a LO voltage output mode.

3. The fault detection system of claim 2, wherein the controller provides a control signal to the generator instructing the generator to operate in the LO voltage output mode during the test period.

4. The fault detection system of claim 2, wherein an output voltage of the generator when operating in the HI voltage output mode is approximately 14.5 volts.

5. The fault detection system of claim 2, wherein the output voltage of the generator when operating in the LO voltage output mode is approximately 12.5 volts.

6. The fault detection system of claim 2, wherein the generator is a linear alternating current generator (ACG) capable of outputting an arbitrary voltage as commanded by the controller.

7. The fault detection system of claim 1, wherein the sensor directly measures at least one of the current flowing out of the battery or the current flowing into the battery.

8. The fault detection system of claim 1, wherein the sensor indirectly measures the battery current by sensing the output current from the generator and the current to vehicle's electrical load.

9. The fault detection system of claim 7, wherein the ground circuit includes an electrical conductor operatively connecting a negative terminal of the battery through the sensor to the electrical ground.

10. In a vehicle having an electrical system including a ground circuit that provides an operative connection from the electrical system to an electrical ground and an electric power generator driven by an engine of the vehicle, said generator arranged to selectively provide electric power to an electrical load of the vehicle and to selectively charge a battery of the vehicle, a method for detecting at least one of an open circuit fault or a high resistance fault in the ground circuit, said method comprising:

(a) controlling a voltage output of the generator so as to at least one of restrict or suspend charging or increase or start charging of the battery by the generator for a designated test period; and (b) determining at least one of a current discharge from the battery during the test period or a charging current into the battery during the test period, wherein if the determined current discharge or charging current is less than a given threshold, then at least one of an open circuit or high resistance fault is deemed to be detected in the ground circuit.

11. The method of claim 10, wherein the generator is operable in one of two modes including a HI voltage output mode and a LO voltage output mode.

12. The method of claim 11, wherein step (a) includes providing a control signal to the generator instructing the generator to operate in the LO voltage output mode during the test period.

13. The method of claim 11, wherein an output voltage of the generator when operating in the HI voltage output mode is approximately 14.5 volts.

14. The method of claim 11, wherein the output voltage of the generator when operating in the LO voltage output mode is approximately 12.5 volts.

15. The method of claim 11, wherein the generator is a linear alternating current generator (ACG) capable of outputting an arbitrary voltage as commanded by the controller.

16. The method of claim 10, wherein step (b) includes directly measuring at least one of the discharge current from the battery or the charging current into the battery.

17. The method of claim 10, wherein step (b) includes indirectly measuring the battery current by sensing the output current from the generator and the current to vehicle's electrical load.

18. The method of claim 10, wherein step (b) includes estimating the battery current based upon operating data characterizing operation of the generator and knowledge of an operational status of the vehicle's electrical load.

19. The method of claim 10, wherein the ground circuit includes an electrical conductor operatively connecting a negative terminal of the battery to the electrical ground.

\* \* \* \* \*